(12) United States Patent
Iguchi et al.

(10) Patent No.: US 6,693,049 B2
(45) Date of Patent: Feb. 17, 2004

(54) METHOD FOR FILLING FINE HOLE

(75) Inventors: Etsuko Iguchi, Tokyo (JP); Takeshi Tanaka, Kanagawa (JP)

(73) Assignee: Tokyo Ohka Kogyo Co., Ltd., Kanagawa (JP)

( * ) Notice: Subject to any disclaimer, the term of this patent is extended or adjusted under 35 U.S.C. 154(b) by 0 days.

(21) Appl. No.: 10/134,757

(22) Filed: Apr. 29, 2002

(65) Prior Publication Data

US 2003/0032280 A1 Feb. 13, 2003

(30) Foreign Application Priority Data

Apr. 27, 2001 (JP) ........................................ 2001-133595

(51) Int. Cl.[7] ........................ H01L 21/31; H01L 21/469
(52) U.S. Cl. ...................... 438/780; 438/618; 438/637; 438/760; 438/778; 438/781; 438/782
(58) Field of Search ................................. 438/424, 438, 438/597, 618, 637, 672, 760, 778, 780, 781, 782

(56) References Cited

U.S. PATENT DOCUMENTS 6,190,833 B1 * 2/2001 Shiota et al. ............ 430/280.1
6,319,815 B1 * 11/2001 Iguchi et al. ................ 438/624
6,319,853 B1 * 11/2001 Ishibashi et al. ............ 438/780
6,406,995 B1 * 6/2002 Hussein et al. ............. 438/638

OTHER PUBLICATIONS

Semiconductor World 1998.1 pp. 108–109.

* cited by examiner

Primary Examiner—Michael S. Lebentritt
Assistant Examiner—Beth E. Owens
(74) Attorney, Agent, or Firm—Carrier, Blackman & Associates, P.C.; Joseph P. Carrier; William D. Blackman

(57) ABSTRACT

A method for filling a fine hole, having a hole pattern diameter of less than or equal to 0.18 μm including steps of: (i) filling the fine hole with filler which is obtained by dissolving into an organic solvent a nitrogen-containing compound having mean molecular weight of less than or equal to 800 and containing at least one compound selected from melamine, benzoguanamine, acetoguanamine, glycoluril, urea, thiourea, guanidine, alkyleneurea and succinylamide, in which hydrogen atoms of amino groups are substituted by at least one hydroxyalkyl group or an alkoxyalkyl groups or both hydroxyalkyl and alkoxyalkyl groups; (ii) drying the filler; and (iii) heating the filler at a temperature of 150–250° C., whereby no bubbles are generated when the fine hole is filled.

3 Claims, 5 Drawing Sheets

PRIOR ART

PRIOR ART

PRIOR ART

PRIOR ART

METHOD FOR FILLING FINE HOLE

BACKGROUND OF THE INVENTION

1. Field of the Invention

The present invention relates to a method for filling a fine hole(s), being less than or equal to 0.18 p μm in the hole pattern diameter, in a case of forming a multilayered wiring structure.

2. Description of Prior Art

FIGS. 1(a) to 1(i) show one example of processes for forming a multilayered wiring structure. In the conventional method for forming such a multilayered wiring structure, first of all, as shown in FIG. 1(a), an aluminum (Al) film is formed on a substrate, on which selectively etched through RIE (Reactive Ion Etching) and the resist mask is removed, as shown in FIG. 1(b), thereby a lower-layer wiring is formed. Next, as shown in FIG. 1(c), SOG (Spin On Glass: a coating liquid obtained by dissolving a silicon compound into an organic solvent such as alcohol) is applied and baked. Although the SOG layer is provided directly on the Al wiring in FIG. 1(c), an insulation layer may be provided between the Al wiring and the SOG layer through a plasma CVD method if necessary. Next, as shown in FIG. 1(d), the surface is flattened by etching-back, and, as shown in FIG. 1(e), SOG is applied on the flattened surface and baked. Through a resist mask provided thereon, as shown in FIG. 1(f), so-called via-holes are formed in this SOG film by selective etching, and Al or the like is embedded in the via-holes. Further, as shown in FIG. 1(g), an aluminum (Al) film is formed, and, as shown in FIG. 1(h), it is etched and thereby an upper layer wiring is formed in the same manner as mentioned above. And, as shown in FIG. 1(i), SOG is applied so as to fill spaces between the upper layer wiring with the SOG, and thereby a multilayered wiring structure is formed. In many of the multilayered wiring structures, five (5) layers are built up in the actual structure by applying such etching technology as mentioned above.

Requirements for high integration of semiconductor devices are increasing more and more, and at present, the new generation of gate length is 0.15 a μm. As a material for the wiring in such a case, it is already known that the characteristics of the semiconductor device can be improved by using copper (Cu) in place of aluminum (Al) used conventionally in the following aspects.

Cu is superior to Al the durability against EM (Electro Migration), and because of a low resistance thereof, it is possible to reduce the signal delay due to the resistance of wiring. Also, it is possible to apply a high current density thereto, i.e., it can increase the allowable current density by three (3) times or more, and thereby miniaturization in the width of the wiring is achieved.

However, since Cu is a difficult material to be etched compared to Al, more attention is paid on a damascene method as one through which the multilayered wiring structure of Cu can be obtained without etching of Cu.

Explanations will be made on the damascene method, in particular, a copper damascene method, by referring to FIGS. 2(a) to 2(g). First, as shown in FIG. 2(a), an inter-layer insulation film of $SiO_2$, SOG, or the like is formed on a substrate using a CVD method, a patterned resist mask is provided on this, and wiring grooves are formed by selective etching and removal of the resist mask, as shown in FIG. 2(b). Next, as shown in FIG. 2(c), barrier metal is accumulated, and as shown in FIG. 2(d), Cu is embedded in the grooves through electroplating or the like so as to form a lower-layer wiring. Next, polishing is conducted upon the barrier metal and the Cu by a CMP (Chemical polishing) method, and thereafter, as shown in FIG. 2(e), another inter-layer insulation film is formed on it. Hereinafter, in the same manner, by selective etching of the inter-layer insulation film through a patterned resist mask, via-holes (contact holes) and trench holes (grooves for an upper-layer wiring) are formed (dual-damascene), as shown in FIG. 2(f). Next, as shown in FIG. 2(g), Cu is embedded in the via-holes and the grooves for an upper-layer wiring through electroplating or the like so as to form an upper-layer wiring.

Such a dual-damascene method for forming via-holes and trench holes in inter-layer insulation films is disclosed in, for example, a monthly magazine ("Semiconductor World", 1998.1, pages 108–109). Hereinafter, examples of such processes will be explained by referring to FIGS. 3(a) to 4(g).

In a method shown in FIGS. 3(a) to 3(g), first as shown in FIG. 3(a), on a semiconductor substrate are formed a first low-k dielectric film and a second low-k dielectric film sequentially. Next, as shown in FIG. 3(b), on the second low-k dielectric film is formed a resist mask having a pattern therein for forming via-holes. Next, as shown in FIG. 3(c), through this resist mask, via-holes are formed through the first low-k dielectric film. As shown in FIG. 3(d), filler such as photo-resist or the like is filled into the via-holes, heated and cured. Next, as shown in FIG. 3(e), the filler cured by heating is etched back, so that the filler remains in the bottom of the via-holes with predetermined thickness. Further, as shown in FIG. 3(f), on the second low-k dielectric film is formed a resist mask having a pattern therein for forming trench holes. As shown in FIG. 3(g), through this resist mask, trench holes are formed in the second low-k dielectric film, while the filler remaining in the bottom of the via-holes is removed at the same time. Next, metal such as copper or the like is embedded in the trench holes and the via-holes (not shown). In this connection, it has been proposed that an etching stopper film (not shown) is provided between layers or between the substrate and the low-k dielectric film.

In a method shown in FIGS. 4(a) to 4(g), first of all, as shown in FIG. 4(a), on the semiconductor substrate is formed a low-k dielectric film. Next, as shown in FIG. 4(b), on the low dielectric film is formed a resist mask having a pattern therein for forming via-holes. Next, as shown in FIG. 4(c), through this resist mask, via-holes are formed in the low-k dielectric film. As shown in FIG. 4(d), filler such as photo-resist is filled into the via-holes, heated and cured. Further, as shown in FIG. 4(e), on the low-k dielectric film is formed a resist mask having a pattern therein for forming trench holes. As shown in FIG. 4(f), trench holes are formed in the low-k dielectric film through the resist mask, while the filler remaining in the bottom of the via-holes is removed. Next, metal is embedded in the trench holes and the via-holes. Also filler having a predetermined thickness may be filled into the bottom of the via-holes without an etching back process as shown in FIGS. 5(a)–5(f).

In addition to the dual-damascene method described above, there is also known another such method wherein trench holes are formed in advance and thereafter via-holes are formed without using filler such as photo-resist.

However, in the dual-damascene method mentioned above, when the trench holes are formed through an etching process after formation of the via-holes, if the surface of the substrate is exposed in the bottom of the via-hole, the surface of the substrate is damaged by the etching gas, and thereby defects in the wiring are caused. Therefore, a photo-resist composition is filled into the bottom of the via-hole as a protection film.

However, in a case where a hole pattern diameter of holes formed by the dual-damascene method is less than or equal to 0.18 μm, the filler is required to be such a material that can be easily filled into such fine holes.

However, even if a conventional photo-resist composition is filled into such fine holes having a hole pattern diameter of less than or equal to 0.18 μm, bubbles generated in the photo-resist composition prevent the photo-resist composition from being perfectly filled and the function of a protection film cannot be obtained. Also, in a case of using the photo-resist composition as filler, it is impossible to leave the protection film having a necessary film thickness in the bottom of the via-hole after exposure and development.

For this reason, conventionally, an amount of a photo-sensitive component having a high light absorption characteristic in the photo-resist composition has been adjusted. However, if there is a lot of the photo-sensitive component in the photo-resist composition, transmission of exposure light is deteriorated, and thereby the resolution property is reduced. If there is little of the photo-sensitive component in the photo-resist composition, everything is exposed by the exposure light, thereby causing a problem that a necessary film thickness of the protection film cannot be maintained.

SUMMARY OF THE INVENTION

Therefore, according to the present invention, for solving such a problem mentioned above, there is provided a method for filling a fine hole, comprising the following steps of: filling the fine hole with filler which is obtained by dissolving a nitrogen-containing compound having mean molecular weight of less than or equal to 800 into an organic solvent; drying; and heating at a temperature of 150–250° C. Also, according to the present invention, further preferable characteristics can be obtained if the filler contains an acid compound or a high light-absorbing component.

As the nitrogen-containing compound having mean molecular weight of less than or equal to 800, for example, melamine compounds, urea compounds, guanamine compounds, acetoguanamine compounds, benzoguanamine compounds, glycol-uril compounds, succinylamide compounds, ethylene urea compounds or the like, in which hydrogen atoms of the amino groups are substituted by at least one of hydroxyalkyl groups or an alkoxyalkyl groups or both hydroxyalkyl and alkoxyalkyl groups, can be used.

These nitrogen-containing compounds can be obtained by reacting the above-mentioned melamine compounds, urea compounds, guanamine compounds, acetoguanamine compounds, benzoguanamine compounds, glycol uryl compounds, succinylamide compounds, ethylene urea compounds or the like with formalin in boiling water for methylolation, or further reacting the obtained reaction product with a lower alcohol such as, methanol, ethanol, n-propanol, isopropanol, n-butanol, isobutanol for alkoxylation.

Among these nitrogen-containing compounds, benzoguanamine compounds, guanamine compounds, melamine compounds, and the urea compounds are preferable, in which at least two of the hydrogen atoms of the amino groups are substituted by methylol groups, or lower alkoxy methyl groups, or both methylol and lower alkoxymethyl groups. In particular, triazine compounds are preferable such as benzoguanamine compounds, guanamine compounds, melamine compounds, or the like. More preferably, these compounds have 3–6 methylol groups or lower alkoxy methyl groups on average per triazine ring.

As the nitrogen-containing compounds, specifically, benzoguanamine compounds such as methoxymethylated benzoguanamine compounds, isobutoxymethylated benzoguanamine compounds, methoxymethylated ethoxymethylated benzoguanamine compounds or the like, and melamine compounds such as methoxymethylated melamine compounds, methoxymethylated isobutoxymethylated melamine compounds or the like, in which 3.7 methoxymethyl groups are substituted on average per triazine ring, can be used. Also, as an example of glycol uril compounds, methylolated glycol uril compounds or the like can be included.

As the organic solvent, any organic solvent having the ability to dissolve the above-mentioned nitrogen-containing compound therein can be used. For example, the following can be used: monovalent alcohol such as methyl alcohol, ethyl alcohol, propyl alcohol and butyl alcohol; polyhydric alcohol such as ethylene glycol, diethylene glycol and propylene glycol; polyhydric alcohol derivatives such as ethylene glycol monomethylether, ethylene glycol monoethylether, ethylene glycol monopropylether, ethylene glycol monobutylether, propylene glycol monomethylether, propylene glycol monoethylether, propylene glycol monopropylether, propylene glycol monobutylether, ethylene glycol monomethylether acetate, ethylene glycol monoethylether acetate, propylene glycol monomethylether acetate, propylene glycol monoethylether acetate; and fatty acids such as acetic acid, propionic acid, or the like. These organic solvents can be used individually or by combining two or more of them. Among them, propylene glycol monomethylether, propylene glycol monomethylether acetate, or the like are preferable.

The ratio in combining a nitrogen-containing compound with an organic solvent should not be limited to a particular one. However, if the concentration is increased, a thick film is obtained. If the concentration is decreased, a thin film is obtained. Thus, the combination ratio between a nitrogen-containing compound and an organic solvent is determined depending upon a film thickness to be desired. Normally, it is used within a range of 0.5–30 wt %, and particularly preferably, 1.0–10 wt %.

Also, if necessary, it is possible to add an acid compound or a high light-absorbing component. The acid compound is used as a crosslinking accelerating agent for the filler. For example, the following can be used: inorganic or organic acids having a sulfur-containing acid residue or ester thereof, and compounds generating acid with active light rays (i.e., acid-generating agents). These acid compounds have such effects that the compounds accelerate crosslinking of the filler and thereby decrease baking temperature to simplify processes.

As the inorganic acid having a sulfur-containing acid residue, for example, sulfuric acid, sulfurous acid, thiosulfuric acid or the like can be used, and in particular, sulfuric acid is preferable. As the organic acid having a sulfur-containing acid residue, for example, organic sulfonic acid or the like can be used. As the ester thereof, for example, organic sulfate, organic sulfite or the like can be used. Among these, in particular, the organic sulfonic acid is preferable, which can be expressed by the following general formula (I):

$$R^1—X \qquad (I)$$

(In the formula, "$R^1$" indicates a hydrocarbon group, which may or may not have a substituent, and "X" indicates a sulfonic acid group.)

In the above-mentioned general formula (I), "$R^1$" is preferably a hydrocarbon group having a carbon number of 1–20 is preferable, and this hydrocarbon group may be saturated or unsaturated, and may be straight, branched chain, or cyclic. As the substituent, a halogen atom such as a fluorine atom, a sulfonic acid group, a carboxyl group, a hydroxyl group, an amino group, a cyano group or the like can be used, and these substituents may be introduced individually (1) or in a plurality thereof.

Specific examples of "$R^1$" include an aromatic hydrocarbon group such as a phenyl group, a naphthyl group, or an anthracenyl group, and among of these, a phenyl group is preferable. Also, the aromatic ring of these aromatic hydrocarbon groups may be bound with one or more alkyl group(s) having a carbon number of 1–20. In addition, this aromatic ring may be substituted by one or more substituents such as a halogen atom such as a fluorine atom, a sulfonic group, a carboxyl group, a hydroxyl group, an amino group, a cyano group or the like.

As the organic sulfonic acid, from the viewpoint of an effect of improving a lower portion form of a photo-resist pattern, in particular, nonafluorobutanesulfonic acid, methanesulfonic acid, trifluoromethanesulfonic acid, dodecylbenzenesulfonic acid, p-toluenesulfonic acid, or a mixture thereof is preferable.

As an acid-generating agent, for example, the following compounds can be used:

(a) bissulfonyldiazomethanes such as bis(p-toluenesulfonyl)diazomethane, methylsulfonyl-p-toluenesulfonyldiazomethane, 1-cyclohexylsulfonyl-1-(1,1-dimethylethylsulfonyl)diazomethane, bis(1,1-dimethylethylsulfonyl)diazomethane, bis(1-methylethylsulfonyl)diazomethane, bis(cyclohexylsulfonyl)diazomethane, bis(2,4-dimethylphenylsulfonyl)diazomethane, bis(4-ethylphenylsulfonyl)diazomethane, bis(3-methylphenylsulfonyl)diazomethane, bis(4-methoxyphenylsulfonyl)diazomethane, bis(4-fluorophenylsulfonyl)diazomethane, bis(4-chlorophenylsulfonyl)diazomethane and bis(4-tert-butylphenylsulfonyl)diazomethane;

(b) nitrobenzyl derivatives such as p-toluenesulfonic acid-2-nitrobenzyl, p-toluenesulfonic acid-2,6-dinitrobenzyl and p-trifluoromethylbenzenesulfonic acid-2,4-dinitrobenzyl;

(c) polyhydroxy compounds and aliphatic or aromatic sulfonates such as pyrogallol methane sulfonate (pyrogallol trimesylate), pyrogallol benzene sulfonate, pyrogallol p-toluene sulfonate, pyrogallol p-methoxy benzene sulfonate, pyrogallol mesitylene sulfonate, pyrogallol benzyl sulfonate, alkyl gallate methane sulfonate, alkyl gallate benzene sulfonate, alkyl gallate p-toluene sulfonate, alkyl gallate p-methoxybenzene sulfonate, alkyl gallate mesitylene sulfonate and alkyl gallate benzyl sulfonate;

(d) onium salts such as diphenyl iodonium tetrafluoroborate, diphenyl iodonium hexafluorophosphate, diphenyl iodonium hexafluoroantimonate, diphenyl iodonium trifluoromethanesulfonate, (4-methoxyphenyl)phenyl iodonium hexafluoroantimonate, (4-methoxyphenyl) phenyl iodonium trifluoromethanesulfonate, bis(p-tert-butylphenyl)iodonium tetrafluoroborate, bis(p-tert-butylphenyl)iodonium hexafluorophosphate, bis(p-tert-butylphenyl)iodonium hexafluoroantimonate, bis(p-tert-butylphenyl)iodonium trifluoromethanesulfonate, triphenyl sulfonium hexafluorophosphate, triphenyl sulfonium hexafluoroantimonate and triphenyl sulfonium trifluoromethanesulfonate;

(e) sulfonyl carbonyl alkanes such as 25 2-methyl-2-(p-toluenesulfonyl)propiophenone, 2-(cyclo hexy lcarbon y l)-2-(p-toluenesulfonyl)propane, 2-methanesulfonyl-2-methyl-(4-methylthio)propiophenone and 2,4-dimethyl-2-(p-toluenesulfonyl)pentane-3-one;

(f) sulfonylcarbonyl diazomethanes such as 1-p-toluenesulfonyl-1-cyclohexylcarbonyl diazomethane, 1-diazo-1-methylsulfonyl-4-phenyl-2-butanone, 1-cyclohexylsulfonyl-1-cyclohexylcarbonyl diazomethane, 1-diazo-1-cyclohexylsulfonyl-3,3-dimethyl-2-butanone,1-diazo-1-(1,1-dimethylethylsulfon yl)-3,3-dimethyl-2-butanone, 1-acetyl-1-(1-methylethylsulfonyl)diazomethane, 1-diazo-1-(p-toluenesulfonyl)-3,3-dimethyl-2-butanone,1-diazo-1-benzenesulfonyl-3,3-dim ethyl-2-butanone, 1-diazo-1-(p-toluenesulfonyl)-3-methyl-2-butanone, 2-diazo-2-(p-toluenesulfonyl)cyclohexyl acetate,2-diazo-2-benzenesulfonyl tert-butyl acetate, 2-diazo-2-methanesulfonyl isopropyl acetate, 2-diazo-2-benzenesulfonyl cyclohexyl acetate and 2-diazo-2-(p-toluenesulfonyl)tert-butyl acetate;

(g) benzoin tosylates such as benzoin tosylate and a-methylbenzoin tosylate;

(h) halogen-containing triazine compounds such as 2-(4-methoxyphenyl)-4,6-bis(trichloromethyl)-1,3,5-triazine, 2-(4-methoxynaphtyl)4,6-bis(trichloromethyl)-1,3,5-triazine, 2-[2-(2-furyl)ethenyl]-4,6-bis(trichloromethyl)-1,3,5-triazine, 2-[2-(5-methyl-2-furyl)ethenyl]-4,6-bis(trichloromethyl)-1,3,5-triazine, 2-[2-(3,5-dimethoxyphenyl)ethenyl]-4,6-bis(trichloromethyl)-1,3,5-triazine, 2-[2-(3,4-dimethoxyphenyl)ethenyl]-4,6-bis(trichloromethyl)-1,3,5-triazine, 2-(3,4-methylenedioxyphenyl)-4,6-bis(trichloromethyl)-1,3,5-triazine, tris(1,3-dibromopropyl)-1,3,5-triazine, tris(2,3-dibromopropyl)-1,3,5-triazine and tris(2,3-dibromopropyl)isocyanurate; and (i) oxime sulfonate compounds such as α-(methylsulfonyloxy imino)phenylacetonitrile, α-(toluenesulfonyloxy imino)phenylacetonitrile, α-(p-chlorobenzenesulfonyloxy imino)phenylacetonitrile, α-(4-nitrobenzenesulfonyloxy imino) phenylacetonitrile, α-(4-nitro-2-trifluoromethylbenzenesulfonyloxy imino) phenylacetonitrile, α-(methylsulfonyloxy imino)-1-phenylacetonitrile, α-(methylsulfonyloxy imino)-4-methoxyphenylacetonitrile, α-(methylsulfonyloxy imino)-1-(p-methylphenyl)acetonitrile, α-(methylsulfonyloxy imino)-1-(p-methoxyphenyl)acetonitrile, α-(benzenesulfonyloxy imino)-4-chlorophenylacetonitrile, α-(benzenesulfonyloxy imino)-2,4-dichlorophenylacetonitrile, α-(benzenesulfonyloxy imino)-2,6-dichlorophenylacetonitrile, α-(benzenesulfonyloxy imino)-2,4-(dichlorophenylacetonitrile, α-(benzenesulfonyloxy imino)-4-methoxyphenylacetonitrile, α-(2-chlorobenzenesulfonyloxy imino)-4-methoxyphenylacetonitrile, α-(benzenesulfonyloxy imino)-2-thienylacetonitrile, α-(4-dodecylbenzenesulfonyloxy imino)phenylacetonitrile, α-(toluenesulfonyloxy imino)-4-methoxyphenylacetonitrile, α-(4-dodecylbenzenesulfonyloxy imino)-4-methoxyphenylacetonitrile, α-(trisulfonyloxy imino)-3-thienylacetonitrile, α-(benzenesulfonyloxy imino)-4-methoxyphenylacetonitrile, α-(ethylsulfonyloxy imino)-4-methoxyphenylacetonitrile, α-(trifluoromethylsulfonyloxy imino)-4-methoxyphenylacetonitrile, α-(propylsulfonyloxy imino)-4-methoxyphenylacetonitrile, α-(methylsulfonyloxy imino)-4-bromophenylacetonitrile, α-(methylsulfonyloxy imino)-1-cyclopentenylacetonitrile, α-(methylsulfonyloxy imino)-1-cyclohexenylacetonitrile, α-(methylsulfonyloxy imino)-1-cycloheptenylacetonitrile, α-(methylsulfonyloxy imino)-1-cyclooctynylacetonitrile, α-(trifluoromethylsulfonyloxy imino)-1-cyclopentenylacetonitrile, α-(trifluoromethylsulfonyloxy imino)-1-cyclohexenylacetonitrile, α-(ethylsulfony imino) ethylacetonitrile, α-(propylsulfonyloxy imino) propylacetonitrile, α-(cyclohexylsulfonyloxy imino) cyclopentylacetonitrile, α-(cyclohexylsulfonyloxy imino)cyclohexylacetonitrile, α-(cyclohexylsulfonyloxy imino)-1-cyclopentenylacetonitrile, α-(1-naphtylsulfonyloxy imino)-4-methoxybenzyl cyanide, α-(2-naphtylsulfonyloxy imino)-4-methoxybenzyl cyanide, α-(1-naphtylsulfonyloxy imino)benzyl cyanide, α-(2-naphtylsulfonyloxy imino)benzyl cyanide, α-(10-camphorsulfonyloxy imino)-4-methoxybenzyl cyanide, α-(10-camphorsulfonyloxy imino)benzyl cyanide, α-(3-camphorsulfonyloxy imino)-4-methoxybenzyl cyanide, α-(3-bromo-10-camphorsulfonyloxy imino)-4-methoxybenzyl cyanide and compounds represented by the following general formula (II) to (XIII):

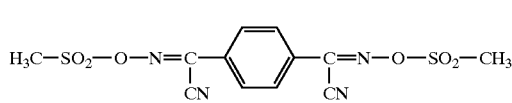
(II)
(III)

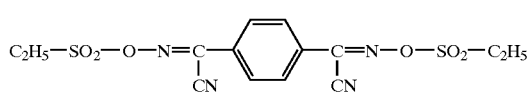
(IV)
(V)

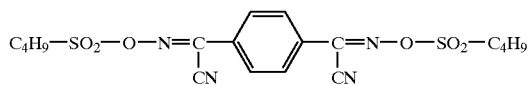
(VI)
(VII)

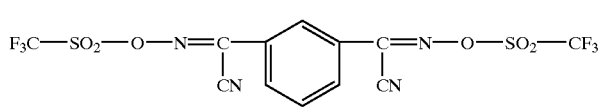
(VIII)

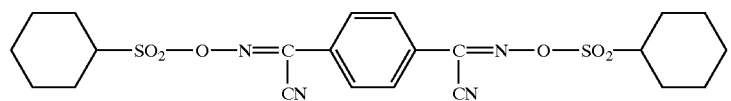
(IX)

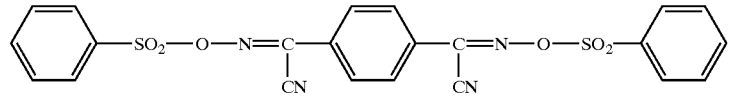
(X)

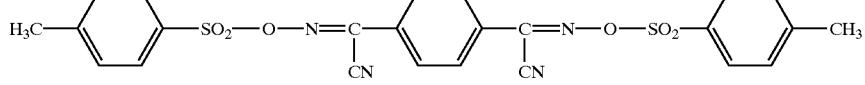
(XI)

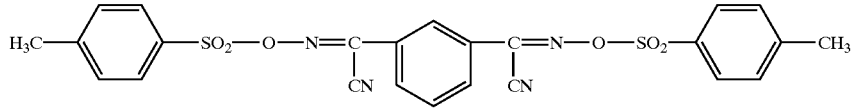
(XII)

(XIII)

(j) imide compounds such as N-methylsulfonyloxy succinimide, N-isopropylsulfonyloxy succinimide, N-chloroethylsulfonyloxy succinimide, N-(p-methoxyphenyl) sulfonyloxy succinimide, N-(p-vinylphenyl)sulfonyloxy succinimide, N-naphtylsulfonyloxy succinimide, N-phenylsulfonyloxy succinimide, N-(2,3,6-triphenyl) sulfonyloxy succinimide, N-methylsulfonyloxy maleimide, N-isopropylsulfonyloxy maleimide, N-chloroethylsulfonyloxy maleimide, N-(p-methoxyphenyl)sulfonyloxy maleimide, N-(p-vinylphenyl)sulfonyloxy maleimide, N-naphtylsulfonyloxy maleimide, N-phenylsulfonyloxy maleimide, N-(2,3,6-triphenyl) sulfonyloxy maleimide, N-methylsulfonyloxy phthalimide, N-isopropylsulfonyloxy phthalimide, N-chloroethylsulfonyloxy phthalimide, N-(p-methoxyphenyl)sulfonyloxy phthalimide, N-(p-vinylphenyl)sulfonyloxy phthalimide, N-naphtylsulfonyloxy phthalimide, N-phenylsulfonyloxy phthalimide and N-(2,3,6-triphenyl)sulfonyloxy phthalimide.

Among acid compounds, in particular, an acid-generating agent is preferable, from the viewpoint of stability for preservation thereof, and the above-mentioned acid-generating agents are basically preferable to be the same group contained in a photo-resist compound for use in lithography.

A highly light-absorbing component is not limited a particular one, to the extent that the component has a high ability to absorb light in a photosensitive wavelength range of a photosensitive component in the photo-resist layer obtained by the present invention, and is able to prevent a standing wave caused by reflection from a substrate and/or diffusion due to unevenness on a substrate surface. As such a highly light-absorbing component, anyone of the following compounds can be used: a salicilate compound, a benzophenone compound, a benzotriazole compound, a cyanoacrylate compound, an azo compound, a polyene compound, an anthraquinone compound, a bisphenyl sulfone compound, a bisphenyl sulfoxide compound, an anthracene compound, etc.

As the components, from the viewpoint of solubility into a nitrogen-containing compound or a solvent, and control over generation of intermixing with respect to a substrate, a benzophenone compound, a bisphenyl sulfone compound, a bisphenyl sulfoxide compound, an anthracene compound or the like can be used. Among these, at least one kind of compound is preferable, which is selected from benzophenones having at least two (2) hydroxyl groups, i.e. polyhydroxybenzophenones, bisphenyl sulfones having at least two (2) hydroxyl groups, bisphenyl sulfoxides having at least two (2) hydroxyl groups, and anthracenes having at least one (1) hydroxyl group, hydroxyalkyl group or carboxyl group. Among these, in a case of using KrF excimer laser for example, an anthracene compound or a bisphenyl sulfone compound is preferable. These may be used individually or by combining two or more.

As the above-mentioned benzophenones having at least two (2) hydroxyl groups, i.e. polyhydroxybenzophenones, the following can be used: 2,4-hydroxybenzophenone, 2,3,4-trihydroxybenzophenone, 2,2',4,4'-tetrahydroxybenzophenone, 2,2',5,6'-tetrahydroxybenzophenone, 2,2'-dihydroxy-4-methoxybenzophenone, 2,6-dihydroxy-4-methoxybenzophenone, 2,2'-dihydroxy-4,4'-dimethoxybenzophenone, 4-dimethylamino-2',4'-dihydroxybenzophenone, 4-dimethylamino-3',4'-dihydroxybenzophenone, etc.

Also, as the above-mentioned bisphenyl sulfones and bisphenyl sulfoxides, each having at least two (2) hydroxyl groups, bis(hydroxyphenyl)sulfone, bis(hydroxyphenyl)sulfoxide, bis(polyhydroxyphenyl)sulfone, and bis(polyhydroxyphenyl)sulfoxide are preferable. Specific examples are as follows: bis(4-hydroxyphenyl)sulfone, bis(3,5-dimehyl-4-hydroxyphenyl)sulfone, bis(4-hydroxyphenyl)sulfoxide, bis(3,5-dimethyl-4-hydroxyphenyl)sulfoxide, bis(2,3-dihydroxyphenyl)sulfone, bis(5-chloro-2,3-dihydroxyphenyl)sulfone, bis(2,4-hydroxyphenyl)sulfone, bis(2,4-dihydroxy-6-methylphenyl)sulfone, bis(5-chloro-2,4-dihydroxyphenyl)sulfone, bis(2,5-dihydroxy phenyl)sulfone, bis(3,4-dihydroxyphenyl)sulfone, bis(3,5-dihydroxyphenyl)sulfone, bis(2,3,4-trihydroxyphenyl)sulfone, bis(2,3,4-trihydroxy-6-methylphenyl)slufone, bis(5-chloro-2,3,4-trihydroxyphenyl)sulfone, bis(2,4,6-trihydroxy phenyl)sulfone, bis(5-chloro-2,4,6-trihydroxyphenyl)sulfone, bis(2,3-hydroxyphenyl)sulfoxide, bis(5-chloro-2,3-dihydroxyphenyl)sulfoxide, bis(2,4-dihydroxyphenyl)sulfoxide, bis(2,4-hydroxy-6-mehylphenyl)sulfoxide, bis(5-chloro-2,4-dihydroxyphenyl)sulfoxide, bis(2,5,-dihydroxyphenyl)sulfoxide, bis(3,4-dihydroxyphenyl)sulfoxide, bis(3,5-dihydroxy phenyl)sulfoxide, bis(2,3,4-trihydroxyphenyl)sulfoxide, bis(2,3,4-trihydroxy-6-methylphenyl)sulfoxide, bis(5-chloro-2,3,4-trihydroxyphenyl)sulfoxide, bis(2,4,6-trihydroxyphenyl)sulfoxide, bis(5-chloro-2,4,6-trihydroxyphenyl)sulfoxide, etc.

As the above-mentioned anthracenes having at least one (1) hydroxyl group, hydroxyalkyl group or carboxyl group, a compound having an anthracene ring and a substituent is used. Examples include a compound which can be expressed by the following general formula (XIV).

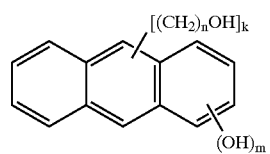

(XIV)

(wherein n is an integer of 1 to 10, m is an integer of 0 to 8, and k is an integer of 0 to 6, however k and n can never be zero (0) at the same time.)

As the compound which can be expressed by the above-mentioned general formula (XIV), specifically the following can be used: 1-hydroxyanthracene; 9-hydroxyanthracene; 1,2-hydroxyanthracene; 1,5-dihydroxyanthracene; 9,10-dihydroxyanthracene; 1,2,3-trihydroxyanthracene, 1-hydroxymethylanthracene; 9-hydroxymeth ylanthracene; 9-hydroxyeth ylanthracene; 9-hydroxyhexylanthracene; 9-hydroxyoctylanthracene; 9,10-dihydroxymethylanthracene, etc. In addition, the following can also be used preferably: 9-anthracene carboxylate; 9,10-anthracene dicarboxylate; grycidylated anthracene carboxylate, grycidylated anthracenylmehylalcohol; and a condensation product of anthracenylmethylalcohol and polyvalent carboxylic acid (for example, oxalic acid, malonic acid, methylmalonic acid, ethylmalonic acid, dimethylmalonic acid, succinic acid, methylsuccinic acid, 2,2-dimethylsuccinic acid, glutaric acid, adipic acid, pimelic acid, etc.).

Among these, particularly 9-anthracene carboxylate and 9,10-anthracene dicarboxylate are preferable, from the viewpoint of the properties of the light absorption etc.

DETAILED DESCRIPTION OF THE PREFERRED EMBODIMENT

Figure 1:
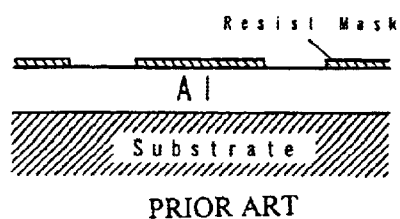
FIGS. 1(a) to 1(i) are views for explaining general forming steps of a multilayered wiring structure.
Figure 1:
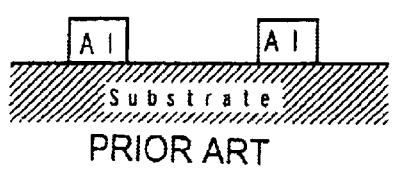
Figure 1:
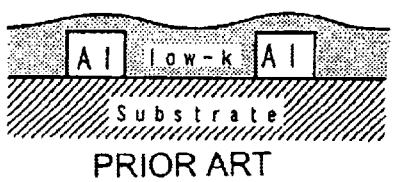
Figure 1:
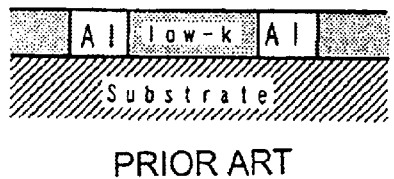
Figure 1:
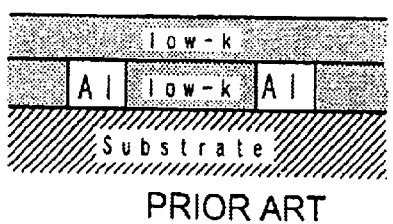
Figure 1:
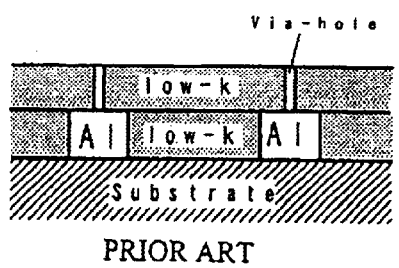
Figure 1:
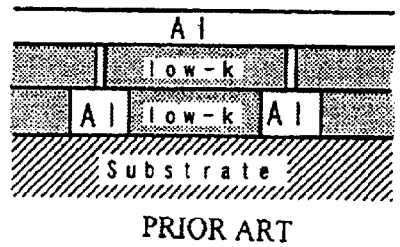
Figure 1:
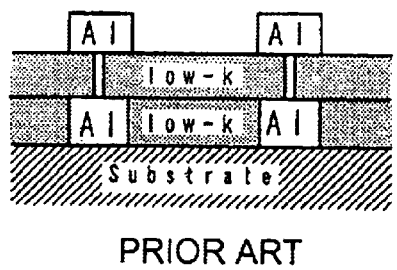
Figure 1:
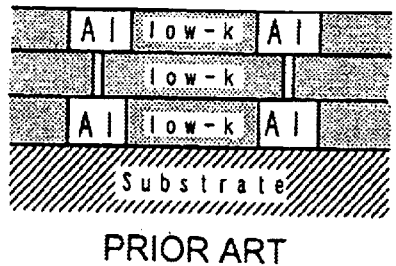
Figure 2:
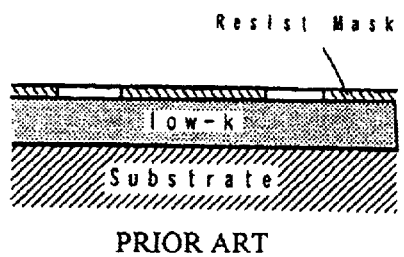
FIGS. 2(a) to 2(g) are views for explaining forming steps of a multilayered wiring structure through a copper damascene method.
Figure 2:
Figure 2:
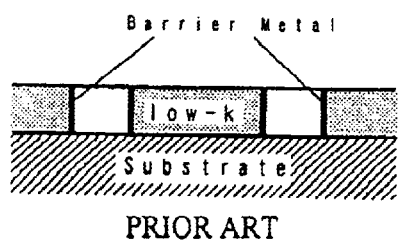
Figure 2:
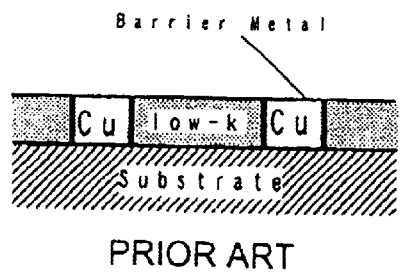
Figure 2:
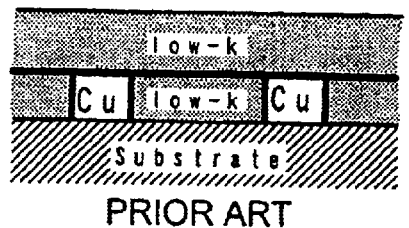
Figure 2:
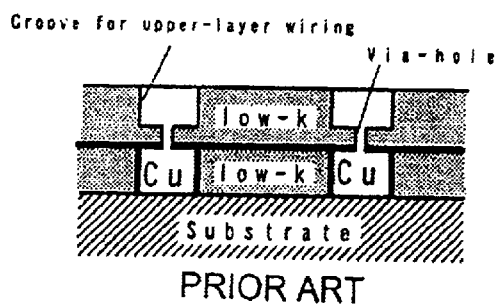
Figure 2:
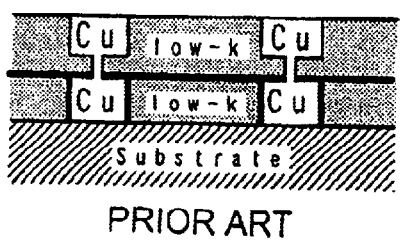

Hereinafter, embodiments according to the present invention will be explained.

Example 1

Methoxymethylated benzoguanamine (mean molecular weight=700), in which 3.7 methoxymethyl groups were substituted per triazine ring, and dodecylbenzenesulfonic acid (wt % 100:3) were dissolved into propylene glycol monomethylether ether, and the solid content concentration was adjusted to be 7.23 wt %.

The above-mentioned composition was applied onto a substrate having hole patterns (0.22 µm; aspect ratio: 4) while the substrate was rotated at 1,800 rpm, and thereafter, it was heated for 90 seconds at a temperature of 180° C. It was observed through an SEM (scanning electron microscope).

As a result, the inside of the hole was completely filled with the composition.

Comparison 1

In place of the composition used in Example 1, polymethyl methacrylate and trimethylated benzoguanamine (wt % 34:100; mean molecular weight=1,530) were dissolved into propylene glycol monomethyl ether, and the solid content concentration was adjusted to be 7.40 wt %.

It was observed through an SEM (scanning electron microscope). Bubbles called a "void" were generated within the hole.

Comparison 2

In place of the composition used in Example 1, methoxymethylated ethoxymethylated benzoguanamine having a carboxyl group (mean molecular weight÷2,500) was dissolved into propylene glycol monomethyl ether, and the solid content concentration was adjusted to be 7.40 wt %.

It was observed through an SEM (scanning electron microscope). Bubbles called a "void" were generated within the hole.

As is described in the above, according to the present invention, since a nitrogen-containing compound having mean molecular weight of less than or equal to 800 dissolved into an organic solvent is used as a material for filling a fine hole having a hole pattern diameter of less than or equal to 0.18 µm, no bubble is generated at the time of being applied to the fine hole. Therefore, a desired protection film can be formed.

What is claimed is:

1. A method for filling a fine hole, having a hole pattern diameter of less than or equal to 0.18 µm, comprising the following steps of:

(i) filling said fine hole with filler which is obtained by dissolving into an organic solvent a nitrogen-containing compound having a mean molecular weight of less than or equal to 800 and containing at least one compound selected from melamine, benzoguanamine, acetoguanamine, glycol-uril, urea, thiourea, guanidine, alkylene urea and succinylamide, in which hydrogen atoms of amino groups are substituted by at least one hydroxyalkyl group or an alkoxyalkyl group or both hydroxyalkyl and alkoxyalkyl groups;

(ii) drying said filler; and (iii) heating said filler at a temperature of 150–250° C.

2. The method for filling a fine hole defined in claim 1, wherein said filler further includes an acid compound.

3. The method for filling a fine hole defined in claim 1 or 2, wherein said filler further includes a highly light-absorbing component.

* * * * *

UNITED STATES PATENT AND TRADEMARK OFFICE
CERTIFICATE OF CORRECTION

PATENT NO.    : 6,693,049 B2
DATED         : February 17, 2004
INVENTOR(S)   : Iguchi et al.

It is certified that error appears in the above-identified patent and that said Letters Patent is hereby corrected as shown below:

Title page,
Item [57], ABSTRACT,
Line 11, change "alkoxyalkyl groups" to -- alkoxyalkyl group --.

Column 1,
Line 15, after "formed on a substrate, on which" insert -- is provided a resist mask having a pattern, and thereafter the aluminum (A1) layer is --.

Column 2,
Line 39, change "on the low dielectric" to -- on the low-k dielectric --.

Column 3,
Line 38, change "least one of hydroxyalkyl" to -- least one hydroxyaklyl --.

Column 4,
Line 2, change "Also, as an example of glycol uril compounds," to -- Also, as an example of glycol-uril compounds, --.
Line 3, change "methylolated glycol uril compounds" to -- methylolated glycol-uril compounds --.

Column 6,
Lines 13-14, change "(g) benzoin tosylates such as benzoin tosylate and a-methylbenzoin tosylate;" to -- (g) benzoin tosylates such as benzoin tosylate and α-methylbenzoin tosylate; --.

Signed and Sealed this

Thirteenth Day of July, 2004

JON W. DUDAS
*Acting Director of the United States Patent and Trademark Office*

UNITED STATES PATENT AND TRADEMARK OFFICE
CERTIFICATE OF CORRECTION

PATENT NO.         : 6,693,049 B2
APPLICATION NO. : 10/134757
DATED                 : February 17, 2004
INVENTOR(S)       : Iguchi et al.

It is certified that error appears in the above-identified patent and that said Letters Patent is hereby corrected as shown below:

Title page:
    Item (57), the ABSTRACT, 11th line, change "groups or both" to --group or both--.

Figure 3:
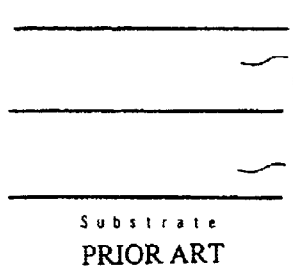
FIGS. 3(a) to 3(g) are views for explaining an example of a dual-damascene method.
Figure 3:
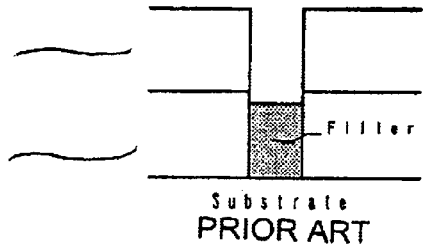
Figure 3:
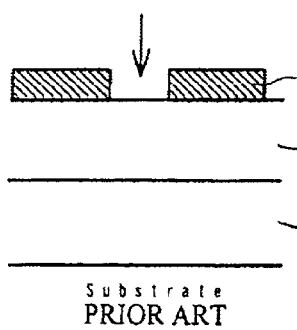
Figure 3:
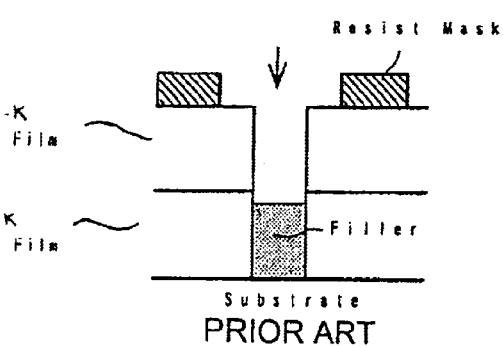
Figure 3:
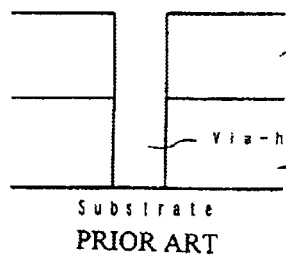
Figure 3:
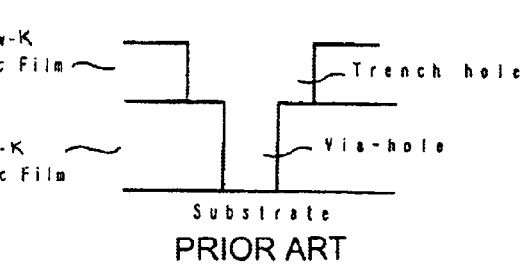
Figure 3:
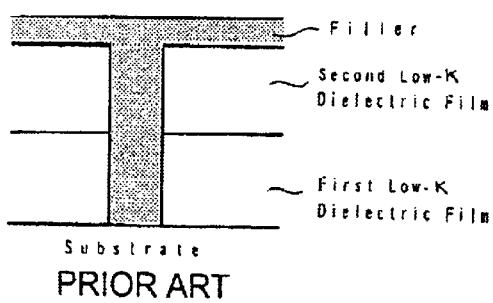
Figure 5:
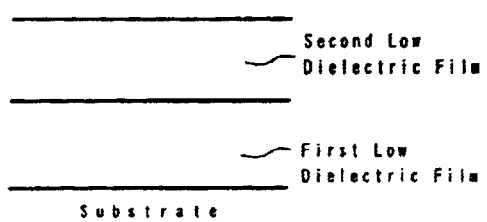
FIGS. 5(a) to 5(f) are views for explaining another example of a dual-damascene method.
Figure 5:
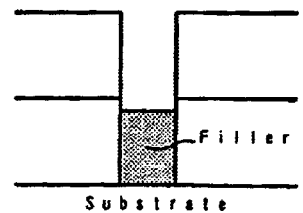
Figure 5:
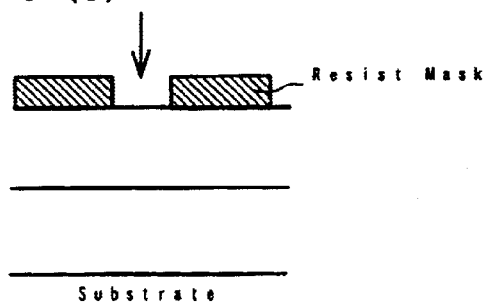
Figure 5:
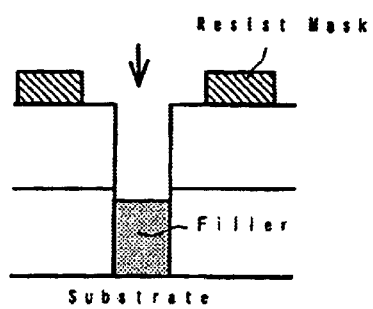
Figure 5:
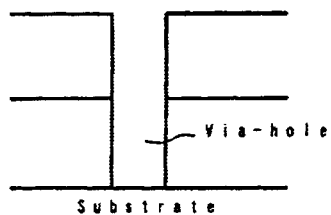
Figure 5:
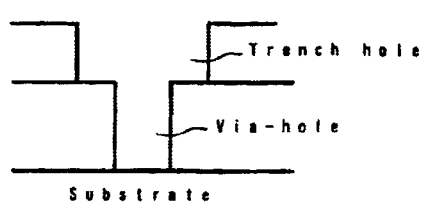

Drawings:
    On sheet 3 of 5, in the captions between Fig. 3(a) and Fig. 3(e), in the captions between Fig. 3(b) and Fig. 3(f), in the captions between Fig. 3(c) and Fig. 3(g), and in the captions to the right of Fig. 3(d), change "Second Low-K" to --Second Low-k-- and change "First Low-K" to --First Low-k--.
    Sheet 5 of 5, in the captions to the right of Fig. 5(a), change "Second Low" to --Second Low-k--; change "First Low" to --First Low-k--.

Column 1:
    Line 7, change "0.18 p $\mu$m" to --0.18 $\mu$m--.
    Line 15, change "on which selectively etched" to --on which is provided a resist mask having a pattern, and thereafter the aluminum (Al) layer is selectively etched--.
    Line 40, change "0.15 a $\mu$m" to --0.15 $\mu$m--.
    Line 45, change "Al the durability" to --Al in the durability--.

Figure 4:
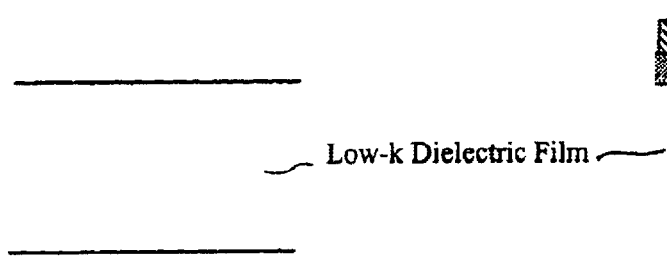
FIGS. 4(a) to 4(f) are views for explaining another example of a dual-damascene method.
Figure 4:
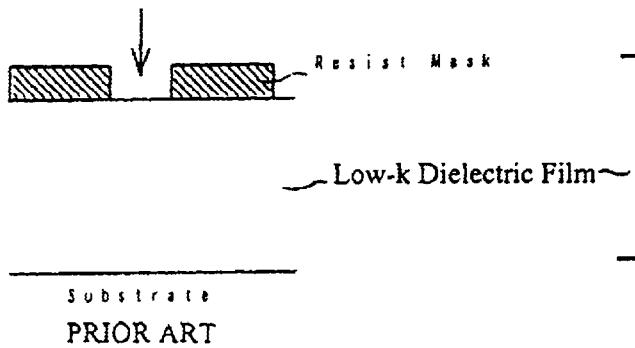
Figure 4:
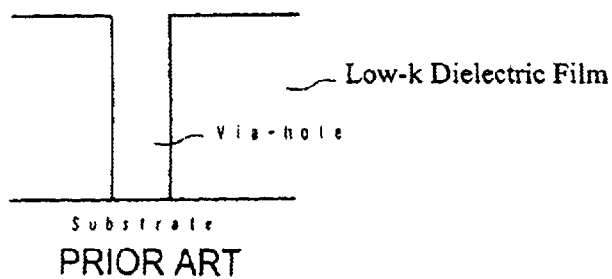
Figure 4:
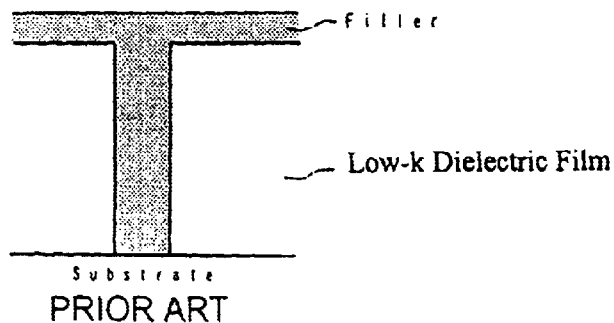
Figure 4:
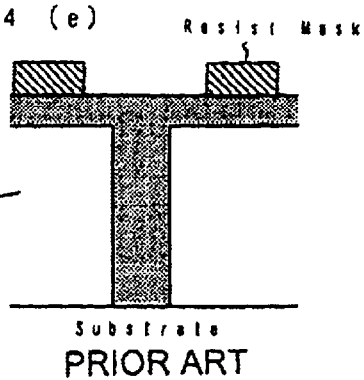
Figure 4:
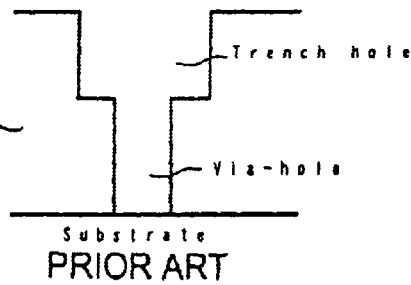

Column 2:
    Line 36, change "FIGS. 4(*a*) to 4(*g*)" to --FIGS. 4(*a*) to 4(*f*)-- (there is no Fig. 4(g)).
    Line 39, change "on the low dielectric" to --on the low-k dielectric--.
    Line 50, change "Also filler having" to --Also, filler having--.

Column 3:
    Line 38, change "least one of hydroxyalkyl groups or an alkoxyalkyl groups" to --least one hydroxyalkyl group or an alkoxyalkyl group--.
    Line 43, change "glycol uryl" to --glycol-uril--.
    Line 47, change "such as, methanol," to --such as methanol,--.
    Line 48, change "n-butanol, isobutanol for" to --n-butanol, or isobutanol, for--.
    Line 54, change "or lower alkoxy" to --or lower alkoxy- --.
    Line 59, change "or lower alkoxy" to --or lower alkoxy- --.
    Line 67, change "3.7 methoxym-" to --3.7 methoxy- --.

UNITED STATES PATENT AND TRADEMARK OFFICE
CERTIFICATE OF CORRECTION

PATENT NO.       : 6,693,049 B2
APPLICATION NO.  : 10/134757
DATED            : February 17, 2004
INVENTOR(S)      : Iguchi et al.

It is certified that error appears in the above-identified patent and that said Letters Patent is hereby corrected as shown below:

Column 4:
    Line 1, change "ethyl groups" to --methyl groups--.
    Line 2, change "glycol uril" to --glycol-uril--.
    Line 3, change "glycol uril" to --glycol-uril--.
    Line 59, delete "is preferable".

Column 5:
    Line 1, change "and among of these" to --and of these--.
    Line 38, change "pyrogallol p-methoxy" to --pyrogallol p-methoxy- --.
    Line 59, delete "25".
    Line 60, change "2-(cyclo hexy lcarbon" to --2-(cyclohexylcarbonyl)- --.
    Line 61, delete "y l)-".

Column 6:
    Line 3, change "dimethylethylsulfon yl)" to --dimethylethylsulfonyl)--.
    Line 6, change "dim ethyl" to --dimethyl--.
    Line 14, change "a-methylbenzoin" to --α-methylbenzoin--.
    Line 17, change "methoxynaphtyl)4,6" to --methoxynaphthyl)-4,6--.

Column 7:
    Line 52, change "α-(ethylsulfony" to --α-(ethylsulfonyloxy--.
    Line 60, change "naphtylsulfonyloxy" to --naphthylsulfonyloxy--.
    Line 61, change "α-(1-naphtylsulfonyloxy" to --α-(1-naphthylsulfonyloxy--.
    Line 62, change "naphtylsulfonyloxy" to --naphthylsulfonyloxy--.

Column 8:
    Line 53, line 60, and line 67, change "N-naphtylsulfonyloxy" to --N-naphthylsulfonyloxy--.

Column 9:
    Line 8, change "is not limited a" to --is not limited to a--.
    Line 15, change "anyone of the" to --any one of the--.
    Line 53, change "(3,5-dimehyl" to --(3,5-dimethyl--.
    Line 61, change "slufone" to --sulfone--.

UNITED STATES PATENT AND TRADEMARK OFFICE
CERTIFICATE OF CORRECTION

PATENT NO.       : 6,693,049 B2
APPLICATION NO.  : 10/134757
DATED            : February 17, 2004
INVENTOR(S)      : Iguchi et al.

It is certified that error appears in the above-identified patent and that said Letters Patent is hereby corrected as shown below:

Column 9 (continued):
   Line 62, change "bis(2,4,6-trihydroxy phenyl)" to --bis(2,4,6-trihydroxyphenyl)--.
   Line 66, change "mehylphenyl" to --methylphenyl--.
   Line 67, change "bis(2,5,-" to --bis(2,5- --.

Column 10:
   Line 2, change "bis(3,5-dihydroxy phenyl)sulfoxide" to --bis(3,5-dihydroxyphenyl)sulfoxide--.
   Line 28, change "1-h" to --1- --.
   Line 29, change "ydroxymethylanthracene; 9-hydroxymeth ylanthracene; 9-h" to --hydroxymethylanthracene; 9-hydroxymethylanthracene; 9- --.
   Line 30, change "ydroxyeth ylanthracene" to --hydroxyethylanthracene--.
   Line 34, change "grycidylated" to --glycidylated--.
   Line 35, change "grycidylated anthracenylmehylalcohol" to --glycidylated anthracenylmethyl alcohol--.
   Line 36, change "of anthracenylmethylalcohol" to --of anthracenylmethyl alcohol--.

Column 11:
   Line 2, change "monomethylether ether," to --monomethylether,--.
   Line 14, change "polym-" to --poly- --.
   Line 15, change "ethyl methacrylate" to --methyl methacrylate--.
   Line 27, change "weight÷2,500" to --weight≒2,500--.

Signed and Sealed this

Twenty-second Day of December, 2009

David J. Kappos
*Director of the United States Patent and Trademark Office*